US008754476B2

(12) United States Patent
Huang

(10) Patent No.: US 8,754,476 B2
(45) Date of Patent: Jun. 17, 2014

(54) HIGH VOLTAGE DEVICE AND MANUFACTURING METHOD THEREOF

(75) Inventor: Tsung-Yi Huang, Hsinchu (TW)

(73) Assignee: Richtek Technology Corporation, R.O.C., Zhubei, Hsin Chu (TW)

( * ) Notice: Subject to any disclaimer, the term of this patent is extended or adjusted under 35 U.S.C. 154(b) by 79 days.

(21) Appl. No.: 13/185,951

(22) Filed: Jul. 19, 2011

(65) Prior Publication Data

US 2013/0020636 A1 Jan. 24, 2013

(51) Int. Cl.
*H01L 29/78* (2006.01)
(52) U.S. Cl.
USPC .................. 257/337; 257/335; 257/E29.256; 438/286; 438/234
(58) Field of Classification Search
USPC ........................................... 257/343; 438/286
See application file for complete search history.

(56) References Cited

U.S. PATENT DOCUMENTS

| 7,476,947 | B2 * | 1/2009 | Ueda et al. ..................... 257/409 |
| 8,143,130 | B1 * | 3/2012 | Huang ........................... 438/289 |
| 8,222,130 | B2 * | 7/2012 | Zhang et al. ................... 438/551 |
| 2005/0285218 | A1 * | 12/2005 | Wu et al. ....................... 257/500 |
| 2007/0278568 | A1 * | 12/2007 | Williams et al. ............... 257/335 |
| 2008/0061400 | A1 * | 3/2008 | Williams et al. ............... 257/546 |
| 2008/0067585 | A1 * | 3/2008 | Williams et al. ............... 257/330 |
| 2009/0184332 | A1 * | 7/2009 | Wu ................................. 257/88 |
| 2009/0224333 | A1 * | 9/2009 | Lu et al. ......................... 257/392 |
| 2010/0213544 | A1 * | 8/2010 | Liu et al. ........................ 257/339 |
| 2010/0301413 | A1 * | 12/2010 | You ............................... 257/343 |
| 2011/0024839 | A1 * | 2/2011 | Zinn et al. ...................... 257/343 |
| 2011/0127602 | A1 * | 6/2011 | Mallikarjunaswamy ..... 257/331 |
| 2011/0182085 | A1 * | 7/2011 | Ko et al. ........................ 362/612 |
| 2011/0303977 | A1 * | 12/2011 | Huang et al. .................. 257/339 |
| 2012/0025307 | A1 * | 2/2012 | Komatsu et al. .............. 257/335 |
| 2012/0187481 | A1 * | 7/2012 | Mallikarjunaswamy ..... 257/334 |

* cited by examiner

*Primary Examiner* — Julio J Maldonado
*Assistant Examiner* — Jaehwan Oh
(74) *Attorney, Agent, or Firm* — Tung & Associates

(57) ABSTRACT

The present invention discloses a high voltage device and a manufacturing method thereof. The high voltage device is formed in a well of a substrate. The high voltage device includes: a field oxide region; a gate, which is formed on a surface of the substrate, and part of the gate is located above the field oxide region; a source and a drain, which are formed at two sides of the gate respectively; and a first low concentration doped region, which is formed beneath the gate and has an impurity concentration which is lower than that of the well surrounded, wherein from top view, the first low concentration doped region has an area within the gate and not larger than an area of the gate, and the first low concentration doped region has a depth which is deeper than that of the source and drain.

10 Claims, 5 Drawing Sheets

HIGH VOLTAGE DEVICE AND MANUFACTURING METHOD THEREOF

BACKGROUND OF THE INVENTION

1. Field of Invention

The present invention relates to a high voltage device and a manufacturing method of a high voltage device; particularly, it relates to such device and manufacturing method wherein the breakdown voltage is increased.

2. Description of Related Art

FIGS. 1A and 1B show a cross-section view and a 3D (3-dimensional) view of a prior art double diffused metal oxide semiconductor (DMOS) device, respectively. As shown in FIGS. 1A and 1B, a P-type substrate 11 has multiple isolation regions 12 by which a device region 100 is defined. The isolation region 12 for example is a shallow trench isolation (STI) structure or a local oxidation of silicon (LOCOS) structure, the latter being shown in the figures. The P-type substrate 11 also includes an N-type well 14. The DMOS device is formed in the device region 100, which includes a gate 13, a drain 15, a source 16, a body region 17, and a body electrode 17a. The drain 15 and the source 16 are formed by a lithography process and an ion implantation process, wherein the lithography process defines the implantation regions by a photoresist mask together with a self-alignment effect provided by all or part of the gate 13 and the isolation regions 12, and the ion implantation implants N-type impurities to the defined regions in the form of accelerated ions. The drain 15 and the source 16 are beneath the gate 13 and at different sides thereof respectively. The body region 17 and the body electrode 17a are formed by another lithography process and another ion implantation process, wherein the lithography process defines the implantation regions by the photoresist mask together with the self-alignment effect provided by all or part of the gate 13 and the isolation regions 12, and the ion implantation implants P-type impurities to the defined regions in the form of accelerated ions. Part of the gate 13 is above the isolation region 12 in the DMOS device. The DMOS device is a high voltage device designed for applications requiring higher operation voltages. However, if it is required for the DMOS device to be integrated with a low voltage device in one substrate, the high voltage device and the low voltage device should adopt the same manufacturing process steps with the same ion implantation parameters, and thus the flexibility of the ion implantation parameters for the DMOS device is limited; as a result, the DMOS device will have a lower breakdown voltage and therefore a limited application range. To increase the breakdown voltage of the DMOS device, additional manufacturing process steps are required, that is, an additional lithography process and an additional ion implantation process are required in order to provide different ion implantation parameters, but this increases the cost.

In view of above, to overcome the drawbacks in the prior art, the present invention proposes a high voltage device and a manufacturing method thereof which provide a higher breakdown voltage and so that the high voltage device may have a broader application range, in which additional manufacturing process steps are not required such that the high voltage device can be integrated with and a low voltage device and manufactured by common manufacturing process steps.

SUMMARY OF THE INVENTION

The first objective of the present invention is to provide a high voltage device.

The second objective of the present invention is to provide a manufacturing method of a high voltage device.

To achieve the objectives mentioned above, from one perspective, the present invention provides a high voltage device, which is formed in a first conductive type substrate, the substrate having a second conductive type well and a device region defined by at least one isolation region in the well, the high voltage device comprising: a field oxide region, which is formed in the device region; a gate, which is formed in the device region on a surface of the substrate, and part of the gate is located above the field oxide region; a second conductive type source, and a second conductive type drain, which are formed at two sides of the gate in the device region respectively, and the drain and the source are separated by the gate and the field oxide region from top view; and a first low concentration doped region having a second conductive type, which is formed beneath the gate and has a second conductive type impurity concentration which is lower than that of the well surrounded, wherein from top view, the first low concentration doped region has an area within the gate and not larger than an area of the gate, and the first low concentration doped region has a depth which is deeper than that of the source and drain.

From another perspective, the present invention provides a manufacturing method of a high device, including: providing a first conductive type substrate having a second conductive type well and a device region defined by at least one isolation region in the well; forming a field oxide region in the device region; forming a first low concentration doped region having a second conductive type in the well; forming a gate in the device region on a surface of the substrate, part of the gate being located above the field oxide region; and forming a second conductive type source and a second conductive type drain at two sides of the gate in the device region respectively, wherein the source and the drain are separated by the gate and the field oxide region from top view; wherein the first low concentration doped region is formed in the well beneath the gate and has a second conductive type impurity concentration which is lower than that of the well surrounded, and wherein from top view, the first low concentration doped region has an area within the gate and not larger than an area of the gate, and the first low concentration doped region has a depth which is deeper than that of the source and drain.

In one embodiment of the high voltage device, the first low concentration doped region preferably surrounds or is adjacent to a boundary of the field oxide region from top view, and the boundary is beneath the gate from cross-section view.

The high voltage device preferably further includes a second low concentration doped region having a second conductive type, which is formed beneath the isolation region and has a second conductive type impurity concentration which is lower than that of the well surrounded, wherein the second low concentration doped region is located at an opposite side of the field oxide region to where the first low concentration doped region is located from top view, or the second low concentration doped region and the first low concentration doped region form a ring structure and part of the second low concentration doped region is located at an opposite other side of the field oxide region to where the first low concentration doped region is located from top view, and the second low concentration doped region has a depth which is deeper than that of the source and drain.

In another embodiment of the high voltage device, the first low concentration doped region and the well are preferably formed by same lithography and ion implantation process steps.

In yet another embodiment, the high voltage device may further include a first conductive type body region, which is formed in the device region beneath the surface of the substrate, wherein the body region surrounds the source from cross-section view, and the body region is adjacent to the gate from top view; and a first conductive type body electrode, which is formed in the body region; wherein the high voltage device is a double diffused metal oxide semiconductor (DMOS) device.

In yet another embodiment, the high voltage device may further include a first conductive type base region, which is formed in the device region beneath the surface of the substrate, wherein the base is adjacent to the gate from top view; and a first conductive type base, which is formed in the base region; wherein the high voltage device is a bipolar junction transistor (BJT) device, the source functioning as a second conductive type emitter of the BJT device, and the drain functioning as a second conductive type collector of the BJT device.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1A:
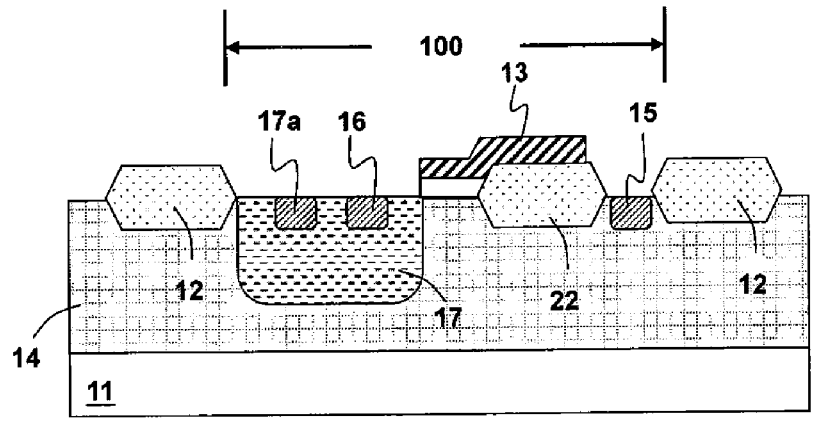
FIG. 1A shows a cross-section view of a conventional DMOS device.
Figure 1B:
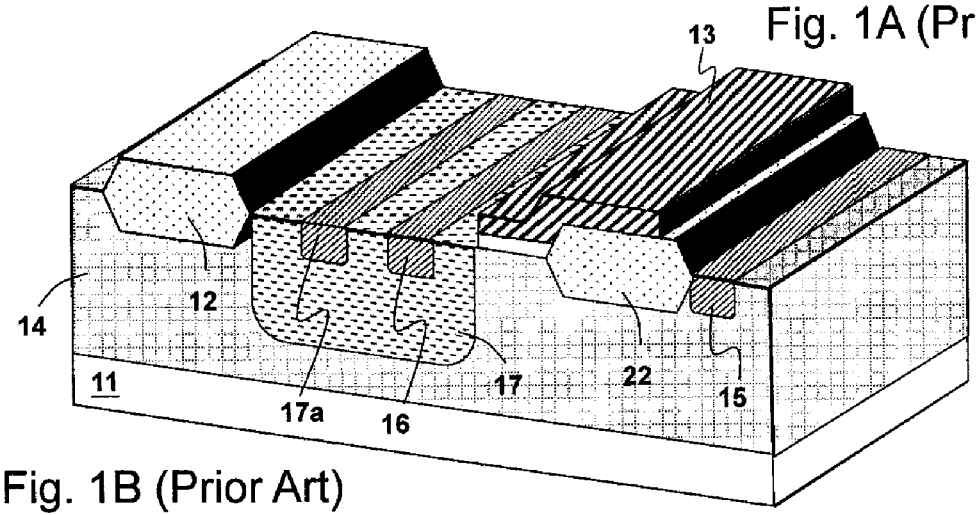
FIG. 1B shows a 3D view of the conventional DMOS device.
Figure 2A:
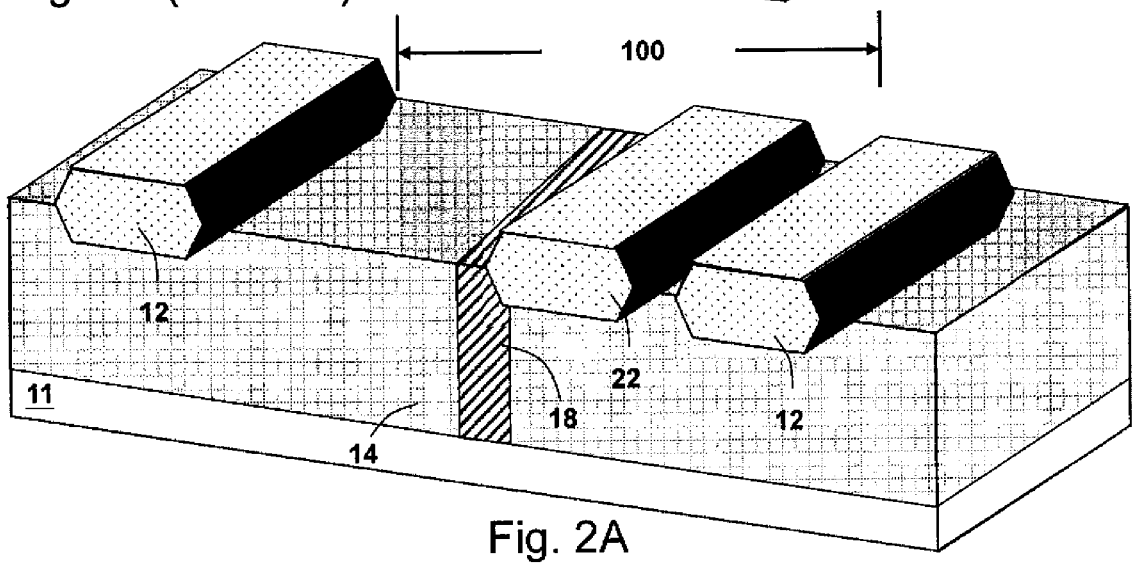
FIGS. 2A and 2B show a first embodiment of the present invention.
Figure 2B:
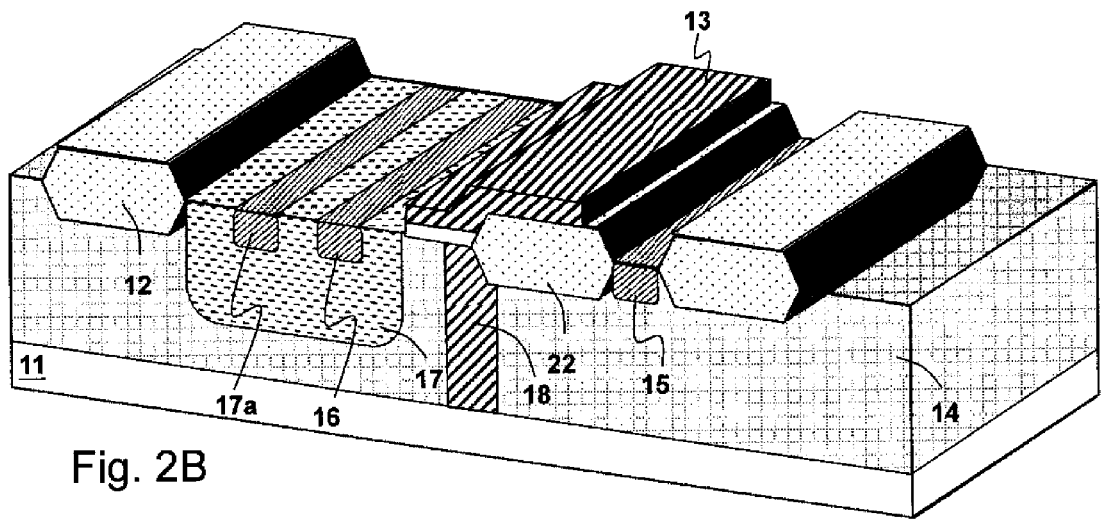

Please refer to FIGS. 2A-2B for a first embodiment according to the present invention, wherein a DMOS device according to the present invention is illustrated in the figures and a corresponding manufacturing method will be explained with reference thereto. In a substrate 11, isolation regions 12 are formed to define a device region 100, wherein the substrate 11 is, for example but not limited to, a P-type substrate (or an N-type substrate in another embodiment), and the isolation structure 12 is, for example, an STI or a LOCOS structure (the latter being shown in the figures). And as shown in FIG. 2A, the substrate 11 includes an N-type well 14 (or a P-type well in another embodiment), which has a different conductive type from the substrate 11. Further, as shown in FIG. 2A, a first low concentration doped region 18 is formed in the well 14, wherein the first low concentration doped region 18 has the same conductive type but lower impurity concentration than that of the surrounded well 14. A field oxide region 22 is formed in the device region 100, wherein the field oxide region 22 is, for example, an STI structure or a LOCOS structure, and it is preferably but not limited to being formed by the same process steps as the isolation region 12. As shown in FIG. 2B, a gate 13, drain 15, source 16, body region 17, and body electrode 17a are formed in the device region 100, wherein the source 16 and drain 15 are, for example but not limited to, N-type (the source 16 and drain 15 may be P-type in another embodiment), and are formed at two sides of the gate 13 in the device region 100 respectively, and are separated by the gate 13 and the field oxide region 22 from top view. The body region 17 is for example but not limited to P-type (or N-type in another embodiment). Note that the first low concentration doped region 18 has a depth deeper than that of the source 16 and drain 15.

This embodiment is different from the prior art in that, in this embodiment, the high voltage device includes the first low concentration doped region 18, which is for example but not limited to, N-type (it may be P-type in another embodiment). This arrangement has the following advantages: First, the DMOS device has better characteristics because the present invention enhances the breakdown voltage of the DMOS device. Second, in manufacturing process, no additional mask or process steps are required if the DMOS device is manufactured in a wafer including other low voltage devices, as typically in a general case. More specifically, the first low concentration doped region 18 may be formed together with the well 14 by the same lithography process and ion implantation process as forming the well 14 so that no additional mask or process steps are required; the process includes: first, masking the first low concentration doped region 18 by the same mask (photoresist mask and/or other masks) when forming the well 14 to block accelerated ions from implanting to the defined first low concentration doped region 18; and second, in the following high temperature diffusion process, thermally diffusing the impurities in the well 14 to the first low concentration doped region 18, such that the first low concentration doped region 18 has a lower impurity concentration compared to the surrounded well 14. As such, the DMOS device in the present invention has a better breakdown voltage but can be manufactured by a low cost.

Figure 3:
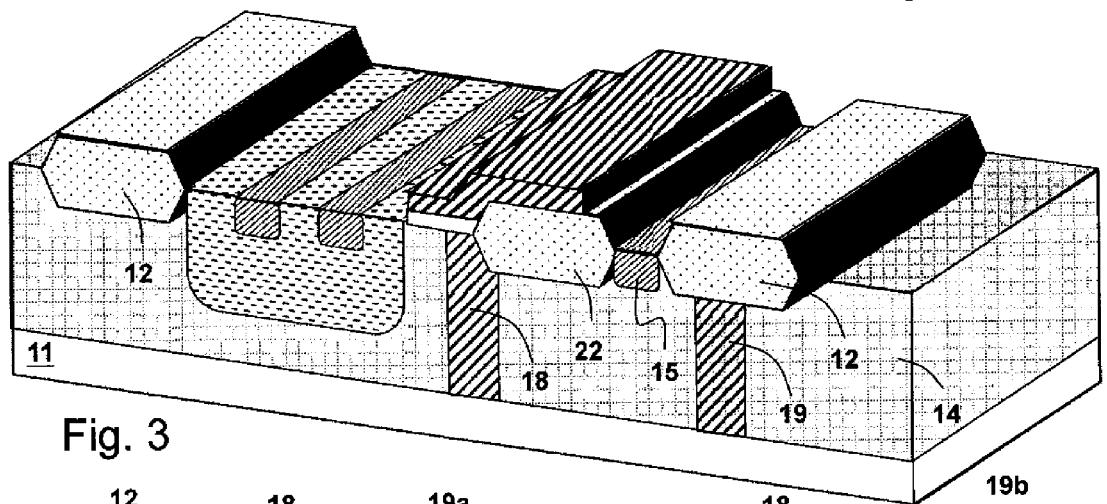
FIG. 3 shows a second embodiment of the present invention.

FIG. 3 shows a second embodiment of the present invention. FIG. 3 is a schematic diagram showing a 3D view of a DMOS device of the present invention. This embodiment is different from the first embodiment in that the DMOS device of this embodiment further includes a second low concentration doped region 19, which has the same conductive type (N-type in this embodiment, and it may be P-type in another embodiment) as the first low concentration doped region 18, and is formed in the well 14 and beneath the isolation region 12 at an opposite side of the drain 15 (and the field oxide region 22) to where the first low concentration doped region 18 is located.

Figure 4:
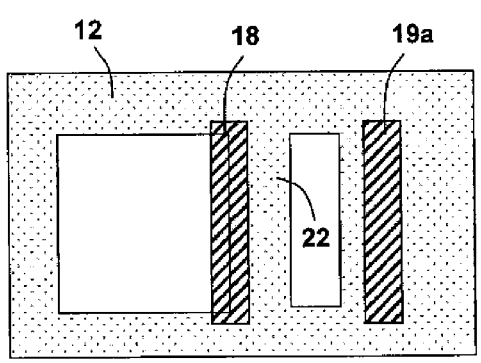
FIGS. 4 and 5 show two layout arrangements of the second embodiment of the present invention from top view.
Figure 5:
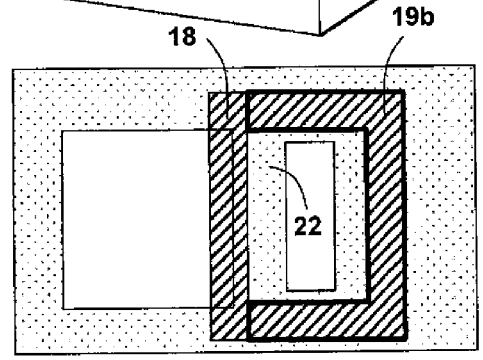

FIGS. 4 and 5 are schematic top view diagrams showing two possible layout arrangements of the aforementioned embodiment. In the layout arrangement shown in the top view of FIG. 4, the second low concentration doped region 19a is located at the opposite side of the field oxide region 22 to where the first low concentration doped region 18 is located. In the layout arrangement shown in the top view of FIG. 5, the second low concentration doped region 19b and the first low concentration doped region 18 form a ring structure, and part of the second low concentration doped region 19b is located at the opposite side of the field oxide region 22 to where the first low concentration doped region 18 is located. In both of the layout arrangements, the N-type impurity concentration of the second low concentration doped region 19b is lower than that of the well 14 surrounded, and the second low concentration doped region 19a or 19b has a depth which is deeper than the source 16 and drain 15.

Figure 6A:
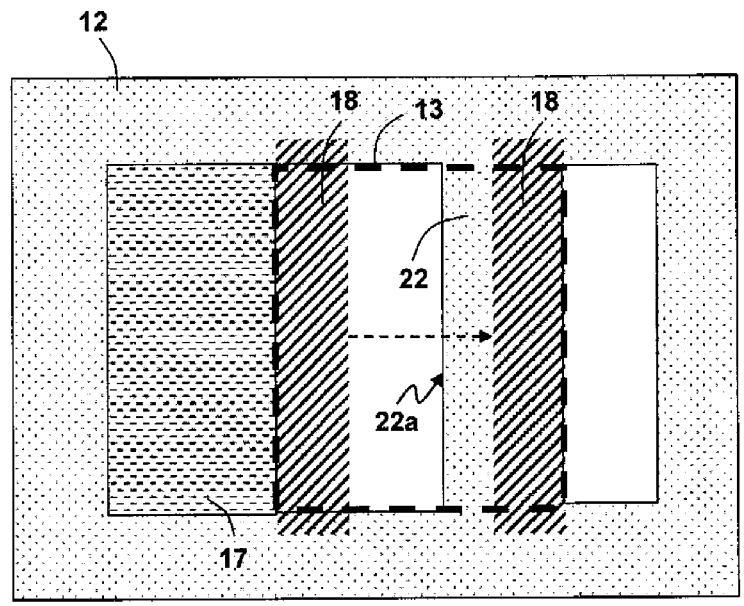
FIGS. 6A and 6B show a preferred layout range of the first low concentration doped region 18 of the present invention.
Figure 6B:
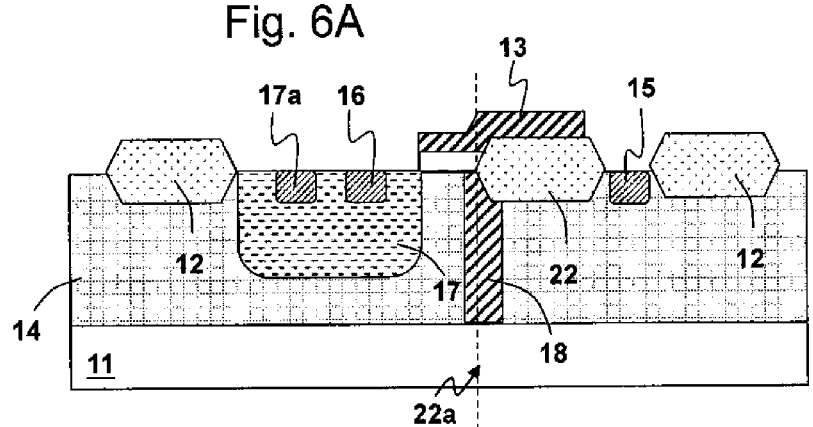

FIGS. 6A-6B show preferred layout range of the first low concentration doped region 18. As shown in the top view of FIG. 6A, the first low concentration doped region 18 is preferably located inside the boundary of the gate 13 (the boundary of the gate 13 is indicated by a thick dash-lined rectangle in FIG. 6A, and also please refer to the 3D view of FIGS. 2B and 3), that is, the first low concentration doped region 18 preferably has an area not larger than the area of the gate 13. The first low concentration doped region 18 more preferably surrounds or is adjacent to a left boundary 22a of the field oxide region 22, which is indicated by a dash line shown in FIG. 6B. The first low concentration doped region 18, which surrounds the left boundary 22a of the field oxide region 22, is located beneath the gate 13 as shown in the cross-section view of FIG. 6B. By such arrangement, the present invention can decrease the electric field around the left boundary 22a, where a local maximum electric field usually happens during normal operation of the high voltage device; thus, the present invention can enhance the breakdown voltage of the high voltage device.

Figure 7A:
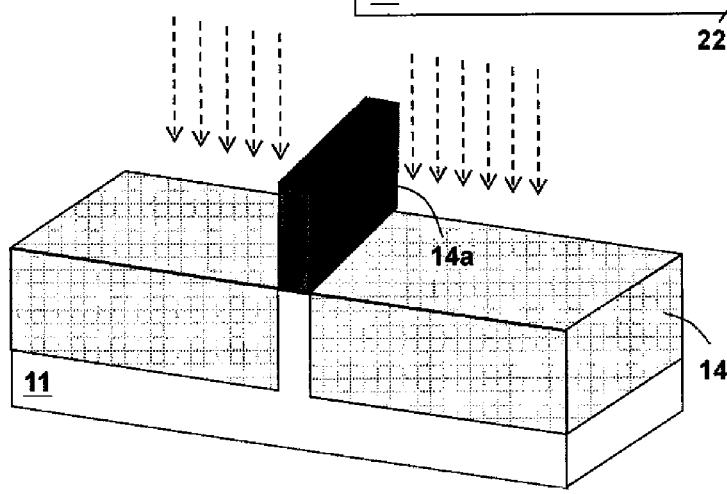
FIGS. 7A-7E show methods of forming the first low concentration doped region 18 of the present invention.
Figure 7B:
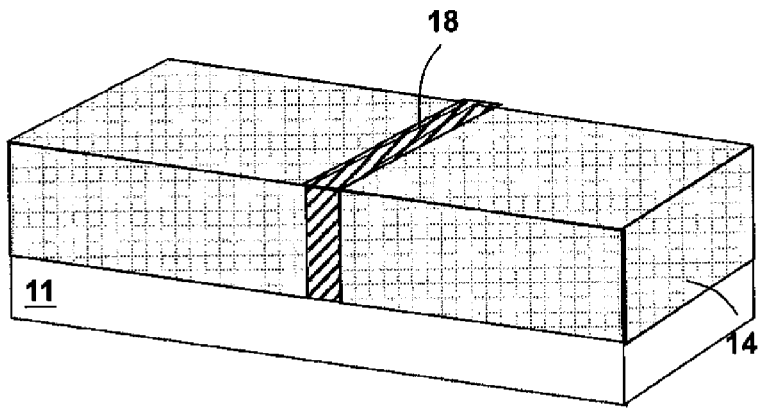

FIGS. 7A-7E show, by way of example, methods for forming the first low concentration doped region 18. As shown in FIG. 7A, in the process step of forming the well 14, the accelerated ions, which are indicated by dashed arrow lines, are masked for example by a photoresist layer 14a so that they are not implanted to the defined first low concentration doped region 18, and next as shown in FIG. 7B, the N-type impurities in the well 14 are diffused to the first low concentration doped region 18 in the following high temperature process step, to form the first low concentration doped region 18 having a lower impurity concentration compared to the surrounded well 14.

Figure 7C:
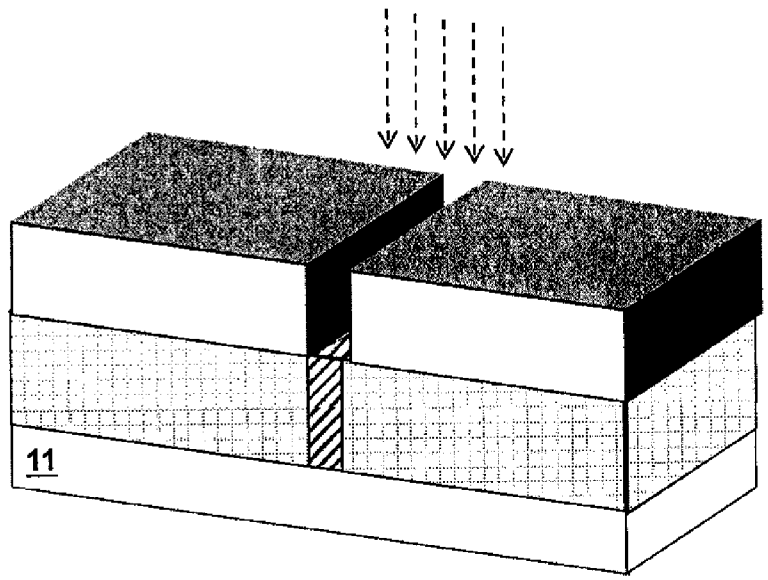

Certainly, the first low concentration doped region 18 can be formed by other ways such as by adding a process step as shown in FIG. 7C following the steps shown in FIG. 7A. Regions outside the first low concentration doped region 18 are masked by a photoresist and/or some other type of mask, and impurities having the same conductive type but with a relatively lower density, or even having opposite conductive type, are implanted to the first low concentration doped region 18 to adjust the impurity concentration of the first low concentration doped region 18, such that the impurity concentration of the first low concentration doped region 18 is lower than the surrounded well 14.

Figure 7D:
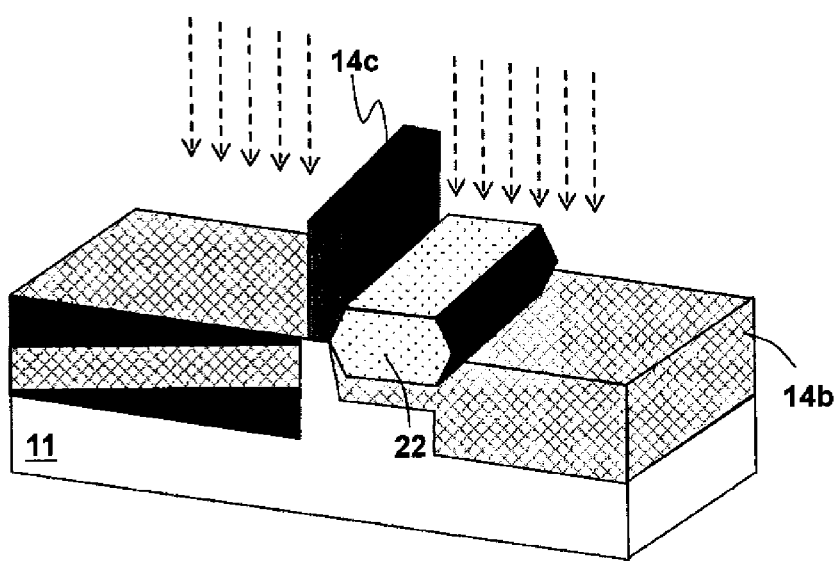
Figure 7E:
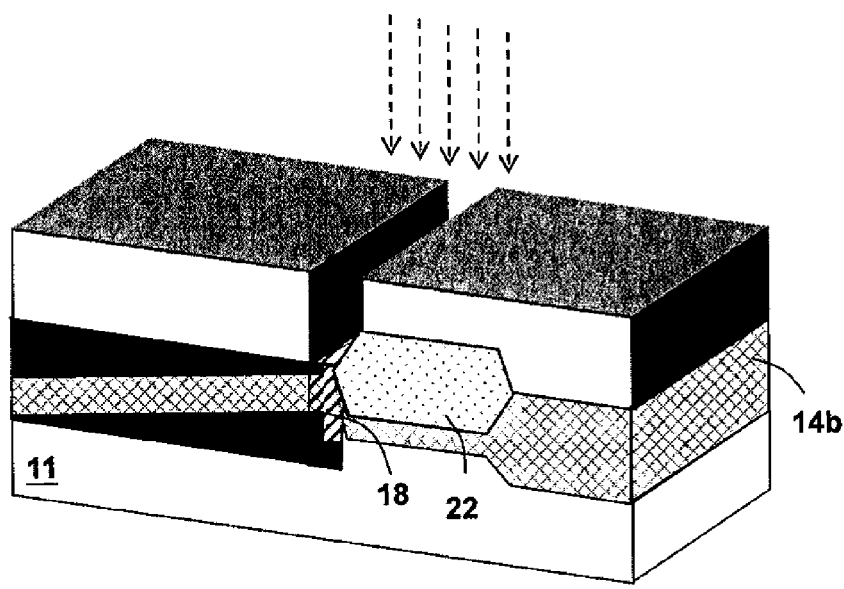

Note that as shown in FIGS. 7D and 7E, the first low concentration doped region 18 can be formed after the field oxide region 22 is formed, instead of before it. As shown in FIG. 7D, in certain application it is required to form a well 14b which is shallower than the well 14, and in the process step of forming the shallow well 14b, the accelerated ions, which are indicated by dashed arrow lines, are masked for example by a photoresist layer 14c so that they are not implanted to the defined first low concentration doped region 18. As shown in FIG. 7E, Regions outside the first low concentration doped region 18 are masked by a photoresist and/or some other type of mask, and impurities having the same conductive type but with a relatively lower density, or even having opposite conductive type, are implanted to the first low concentration doped region 18 to adjust the impurity concentration of the first low concentration doped region 18, such that the impurity concentration of the first low concentration doped region 18 is lower than the surrounded well 14 and shallow well 14b. The above shows that the present invention may be embodied in many ways.

Figure 8:
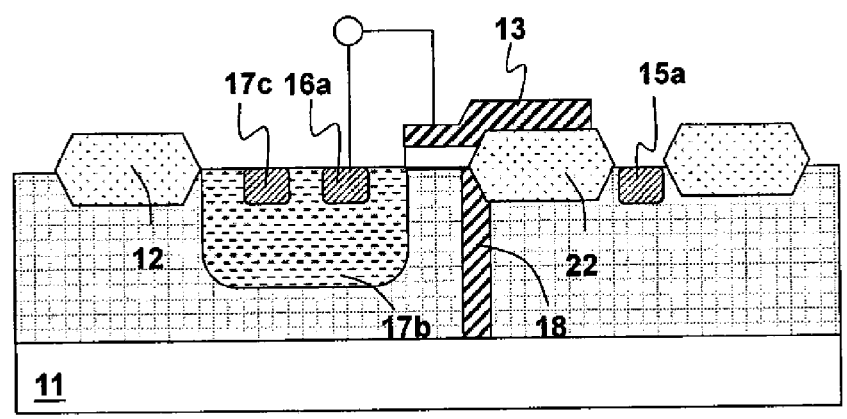
FIG. 8 shows another embodiment of the present invention.

FIG. 8 shows another embodiment of the present invention, which is a cross-section view showing that the present invention can be applied to making a BJT device. This embodiment is different from the first embodiment in that, the BJT device includes a base region 17b, a base 17c, an emitter 16a, and a collector 15a, wherein the gate 13 is preferably coupled to the emitter 16a. In other words, the source in the previous embodiments functions as an emitter of the BJT device in this embodiment, and the drain functions as a collector of the BJT device in this embodiment.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as a deep well, etc., can be added. For another example, the lithography step described in the above can be replaced by electron beam lithography, X-ray lithography, etc. For yet another example, the first low concentration doped region 18 is not limited to being located beside the field oxide 22 as shown in the figures; it may be located anywhere within the gate 13 and not larger than an area of the gate 13 from top view. In view of the foregoing, the spirit of the present invention should cover all such and other modifications and variations, which should be interpreted to fall within the scope of the following claims and their equivalents.

What is claimed is:

1. A high voltage device, which is formed in a first conductive type substrate, the substrate having a second conductive type well and a device region defined by at least one isolation region in the well, the high voltage device comprising:
   a field oxide region, which is formed in the device region;
   a gate, which is formed in the device region on a surface of the substrate, and part of the gate is located above the field oxide region such that the field oxide region has one boundary side beneath the gate;
   a second conductive type source, and a second conductive type drain, which are formed at two sides of the gate in the device region respectively, and the drain and the source are separated by the gate and the field oxide region from top view; and
   a first low concentration doped region having a second conductive type, which is formed beneath the gate and has a second conductive type impurity concentration which is lower than that of the well, wherein from top view, the first low concentration doped region has an area within the gate and not larger than an area of the gate, and the first low concentration doped region has a depth which is deeper than that of the source and drain, and wherein the first low concentration doped region surrounds the one boundary side of the field oxide region so that a part of the first low concentration doped region is located beneath the field oxide region and another part of the first low concentration doped region is located outside the field oxide region.

2. The high voltage device of claim 1, further comprising a second low concentration doped region having a second conductive type, which is formed beneath the isolation region and has a second conductive type impurity concentration which is lower than that of the well surrounded, wherein the second low concentration doped region is located at an opposite side of the field oxide region to where the first low concentration doped region is located from top view, or the second low concentration doped region and the first low concentration doped region form a ring structure and part of the second low concentration doped region is located at an opposite other side of the field oxide region to where the first low concentration doped region is located from top view, and the second low concentration doped region has a depth which is deeper than that of the source and drain.

3. The high voltage device of claim 1, wherein the first low concentration doped region and the well are formed by same lithography and ion implantation process steps by masking the first low concentration doped region in the ion implantation process step.

4. The high voltage device of claim 1, further comprising:
a first conductive type body region, which is formed in the device region beneath the surface of the substrate, wherein the body region surrounds the source from cross-section view, and the body region is adjacent to the gate from top view; and
a first conductive type body electrode, which is formed in the body region;
wherein the high voltage device is a double diffused metal oxide semiconductor (DMOS) device.

5. The high voltage device of claim 1, further comprising:
a first conductive type base region, which is formed in the device region beneath the surface of the substrate, wherein the base is adjacent to the gate from top view; and
a first conductive type base, which is formed in the base region;
wherein the high voltage device is a bipolar junction transistor (BJT) device, the source functioning as a second conductive type emitter of the BJT device, and the drain functioning as a second conductive type collector of the BJT device.

6. A manufacturing method of a high voltage device, comprising:
providing a first conductive type substrate having a second conductive type well and a device region defined by at least one isolation region in the well;
forming a field oxide region in the device region;
forming a first low concentration doped region having a second conductive type in the well, wherein the first low concentration doped region surrounds the one boundary side of the field oxide region so that a part of the first low concentration doped region is located beneath the field oxide region and another part of the first low concentration doped region is located outside the field oxide region;
forming a gate in the device region on a surface of the substrate, part of the gate being located above the field oxide region, such that the field oxide region has one boundary side beneath the gate; and
forming a second conductive type source and a second conductive type drain at two sides of the gate in the device region respectively, wherein the source and the drain are separated by the gate and the field oxide region from top view;
wherein the first low concentration doped region is formed in the well beneath the gate and has a second conductive type impurity concentration which is lower than that of the well, and wherein from top view, the first low concentration doped region has an area within the gate and not larger than an area of the gate, and the first low concentration doped region has a depth which is deeper than that of the source and drain.

7. The manufacturing method of claim 6, further comprising forming a second low concentration doped region having a second conductive type beneath the isolation region and having a second conductive type impurity concentration which is lower than that of the well surrounded, wherein the second low concentration doped region is located at an opposite side of the field oxide region to where the first low concentration doped region is located from top view, or the second low concentration doped region and the first low concentration doped region form a ring structure and part of the second low concentration doped region is located at an opposite other side of the field oxide region to where the first low concentration doped region is located from top view, and the second low concentration doped region has a depth which is deeper than that of the source and drain.

8. The manufacturing method of claim 6, wherein the first low concentration doped region and the well are formed by same lithography and ion implantation process steps by masking the first low concentration doped region in the ion implantation process step.

9. The manufacturing method of claim 6, further comprising:
forming a first conductive type body region in the device region beneath the surface of the substrate, wherein the body region surrounds the source from cross-section view, and the body region is adjacent to the gate from top view; and
forming a first conductive type body electrode in the body region;
wherein the high voltage device is a double diffused metal oxide semiconductor (DMOS) device.

10. The manufacturing method of claim 6, further comprising:
forming a first conductive type base region in the device region beneath the surface of the substrate, the base being adjacent to the gate from top view; and
forming a first conductive type base in the base region;
wherein the high voltage device is a bipolar junction transistor (BJT) device, the source functioning as a second conductive type emitter of the BJT device, and the drain functioning as a second conductive type collector of the BJT device.

* * * * *